(12) United States Patent
Hatano et al.

(10) Patent No.: US 6,518,605 B1
(45) Date of Patent: Feb. 11, 2003

(54) SOLID STATE IMAGING PICKUP DEVICE AND METHOD FOR MANUFACTURING THE SAME

(75) Inventors: Keisuke Hatano, Tokyo (JP); Masayuki Furumiya, Tokyo (JP); Toru Kawasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/770,188

(22) Filed: Jan. 29, 2001

(30) Foreign Application Priority Data

Jan. 27, 2000 (JP) .......................... 2000-018402

(51) Int. Cl.[7] ............................................ H01L 29/768
(52) U.S. Cl. ........................ 257/215; 257/221; 257/222; 257/249
(58) Field of Search ................................ 257/215–251, 257/448, 443, 912; 348/294; 438/75, 144, 147, 148, 587, 588

(56) References Cited

U.S. PATENT DOCUMENTS

| | | | |
|---|---|---|---|
| 5,637,894 A | * 6/1997 | Hori et al. .................. | 257/249 |
| 6,028,629 A | * 2/2000 | Shioyama et al. ........... | 348/294 |
| 6,097,044 A | * 8/2000 | Nakashiba ................... | 257/221 |
| 6,111,279 A | * 8/2000 | Nakashiba ................... | 257/222 |

* cited by examiner

*Primary Examiner*—David Nelms
*Assistant Examiner*—Long Tran
(74) *Attorney, Agent, or Firm*—Sughrue Mion, PLLC

(57) ABSTRACT

A solid state imaging pickup device with a single-layer electrode structure which eliminates the release area at the terminal part of the charge transfer electrodes by surrounding the charge transfer electrodes with a dummy pattern, or with a pattern formed by connecting the charge transfer electrodes of a certain phase with each other at the outermost periphery. Surrounding the charge transfer electrode improves embedding performance when an insulating film is re-flowed for flattening inter-electrode gaps. This enables formation of a good metal wire or shielding film with no step-cut, thus improving the reliability of a solid state imaging pickup device.

9 Claims, 10 Drawing Sheets

SOLID STATE IMAGING PICKUP DEVICE AND METHOD FOR MANUFACTURING THE SAME

BACKGROUND OF THE INVENTION

1. Field of the Invention

The present invention relates to a solid state imaging pickup device and a manufacturing method thereof, and more particularly but not limited to a solid state imaging pick device in which a charge transfer electrode is formed by processing a single-layer conductive electrode material film, characterized in that the controllability or ease of planarizing is improved when planarizing a narrow inter-electrode gap by re-flowing a film.

2. Description of the Related Art.

FIG. 1 shows a cross sectional view of a charge transfer part of a conventional solid state imaging pickup device with a singe-layer electrode structure.

The charge transfer part comprises a charge transfer part 604 that is formed by ion-implanting phosphorus in a first P-type well layer 602 and a second P-type well layer 603 formed on a N-type semiconductor substrate 601, a gate insulating film 605 formed by thermally oxidizing the surface of the N-type semiconductor substrate 601, and a charge transfer electrode 606 that is formed on the gate insulating film 605.

The charge transfer electrode 606 is formed by patterning a one-layer conductive electrode material film with an inter-electrode gap of about 0.25 μm to 0.50 μm.

On the charge transfer electrode 606, an inter-layer insulating film 607 is formed, and a metal shielding film 608 is provided on the inter-layer insulating film 607 to prevent the incidence of light into the charge transfer part.

Cross sectional views of the charge transfer part of a conventional solid state imaging pickup device with a single-layer electrode structure are shown in FIGS. 2 to 4 in the order of manufacturing steps.

First, a P-type well layer 702, a second P-type well layer 703, a charge transfer part 704, and a gate insulting film 705 are formed in turn on an N-type semiconductor substrate 701. Further, on the substrate 701, charge transfer electrodes 706 are formed, having an arca separating them from each other in the charge transfer direction (inter-electrode gap) of a short distance of about 0.25 μm to 0.50 μm (as shown in FIG. 2).

Next, an inter-layer insulating film 707 is formed on the whole surface of the device. At this moment, the inter electrode gap part has a large aspect ratio and the step-covering performance of the insulating film is poor. Therefore, a space (cavity) 709 is produced at the inter-electrode gap part, or the resulting coverage of the surface is defective and/or uneven (as shown in FIG. 3).

Next, a metal shielding film 708 or a metal wiring is formed on the interlayer insulating film 707, but there has been such a problem that a step-cut 710 is produced where the coverage on the inter-layer insulating film 707 is poor at the inter-electrode gap part, such that the shielding characteristic or the charge transfer characteristic may be degraded (as shown in FIG. 4).

A method that has been considered, in order to prevent the step-cut of the metal layer, is filling and planarizing the inter-electrode gap by using an insulator film which provides good re-flow performance when heated, after the charge transfer electrode has been patterned. The process-flow at this moment will be described by using cross sectional views in the order of steps shown in FIGS. 5 to 9.

First, a first P-type well layer 802, a second P-type well layer 803, a charge transfer part 804, and a gate insulating film 805 are formed in turn on an N-type semiconductor substrate 801. Further, on the substrate 801, charge transfer electrodes are patterned so that charge transfer electrodes 806 are formed (as shown in FIG. 5).

Next, a first inter-layer insulating film 811 is formed on the whole surface of the device, and is heat-treated, for example, in an atmosphere of nitrogen at 900° C., thereby re-flowing, and filling up the inter-electrode gaps with the first inter-layer insulating film 811 (as shown in FIG. 6).

Next, the first inter-layer insulating film 811 is etched until the surface of the charge transfer electrodes 806 is exposed, thus forming embedded insulating films 821 (as shown in FIG. 7).

Next, a second inter-layer insulating film 812 is formed on the charge transfer electrodes 806 and the embedded insulating film 821 (as shown in FIG. 8).

Finally, a metal shielding film 808 is formed on the second inter-layer insulating film 812 (as shown in FIG. 9).

By the conventional method described above, it is possible to form the metal shielding film 808 with no step-cut.

However, the above mentioned method of re-flowing the insulating film in an attempt to fill the inter-electrode gaps has the following problems, as described below.

FIG. 10 typically shows a pattern of conventional charge transfer electrodes 906. At the part B–B', there is no adjacent electrode pattern at the terminal part of the electrode pattern, and thus, there is no "wall" for stopping the flow of the film during re-flowing. Therefore, there is a problem in that a fluctuation is caused in the film thickness because the film outflows during re-flowing, resulting in poor embedding performance.

FIGS. 11 and 12 show cross sectional views in the order of steps of the part B–B' in FIG. 10.

First, a first inter-layer insulating film 911 is formed after charge transfer electrodes 906 have been formed, (as shown in FIG. 11).

Next, the first inter-layer insulating film 911 is removed by etching until at least the surface of the charge transfer electrodes 906 is exposed (as shown in FIG. 12).

As this moment, the first inter-layer insulating film 911 remains at the side wall part of the terminal part of the charge transfer electrode 906, and a film thickness uneven area 913 is produced.

It is one object of the present invention to provide a highly reliable solid state imaging pickup device, in which the charge transfer electrodes are formed by patterning a singe-layer conductive electrode material film and the embedding performance is improved in the case where the inter-electrode gap parts are filled with the first inter-layer insulating film for solving the problems of the above described conventional solid state imaging pickup device.

SUMMARY OF THE INVENTION

In an embodiment of the semiconductor device of the present invention, a semiconductor device comprises a gate insulating film formed on a substrate, a plurality of charge transfer electrodes formed on the gate insulating film, and a first inter-electrode insulating film for filling a space between the plurality of charge transfer electrodes, with one charge transfer electrode surrounding at least one other charge transfer electrode.

As a result, the embedding performance of an insulating film is improved when it is re-flowed for flattening the inter-electrode gaps. This enables formation of a good metal wire or shielding film with no step-cut, and makes it possible to provide a solid state imaging pickup device with an improved reliability.

BRIEF DESCRIPTION OF THE DRAWINGS

The above and other objects, advantages and features of the present invention will be more apparent from the following description taken in conjunction with the accompanying drawings, in which.

BRIEF DESCRIPTION OF THE PREFERRED EMBODIMENTS

Next, the present invention will be described by referring to drawings.

It is understood that the invention is not limited to this embodiment, which is provided as only one example of an implementation of the invention. For example the invention is not restricted to a solid state imaging pickup device, and is applicable to other devices having electrodes adjacent to each other where the interlayer insulating film fills an inter-electrode gap.

Figure 1:
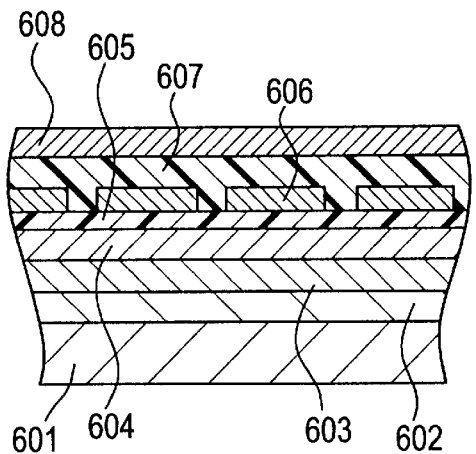
FIG. 1 is a cross sectional view of a conventional solid state imaging pickup device in the related art.
Figure 2:
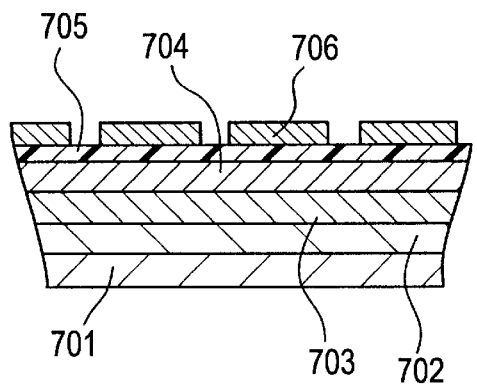
FIG. 2 is a cross sectional view showing a manufacturing method of a conventional solid state imaging pickup device in the related art.
Figure 3:
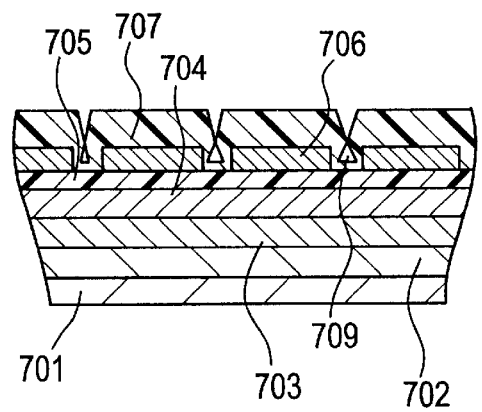
FIG. 3 is a cross sectional view showing a manufacturing step following FIG. 2.
Figure 4:
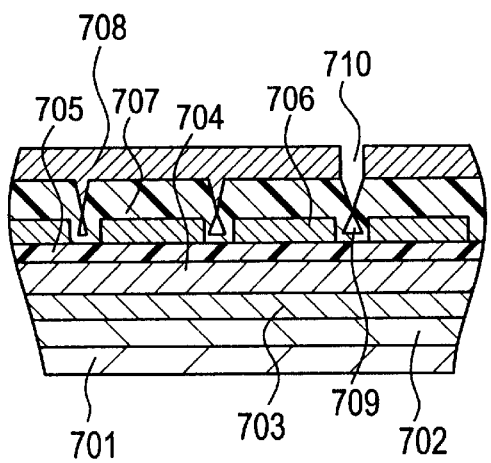
FIG. 4 is a cross sectional view showing a manufacturing step following FIG. 3.
Figure 5:
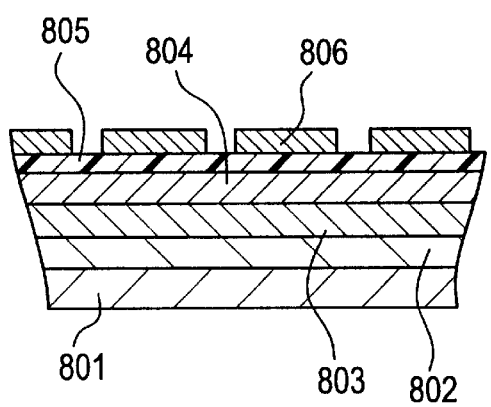
FIG. 5 is a cross sectional view showing a manufacturing method of another conventional solid state imaging pickup device in the related art.
Figure 6:
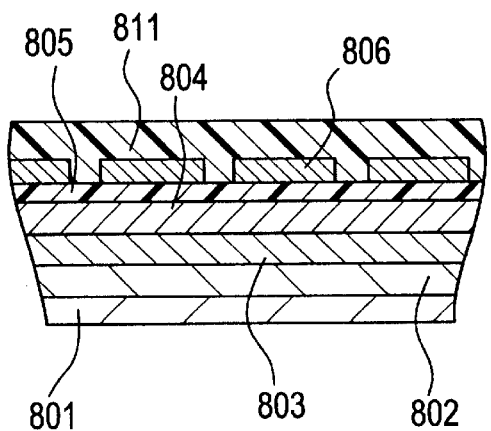
FIG. 6 is a cross sectional view showing manufacturing steps following FIG. 5.
Figure 7:
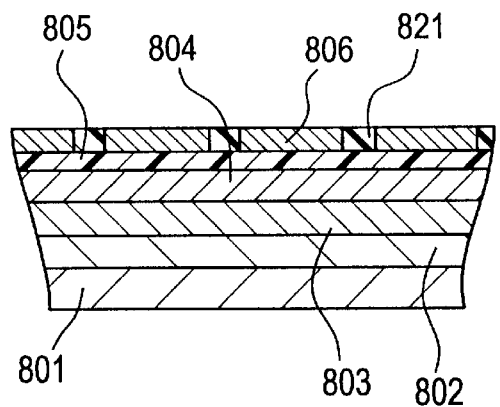
FIG. 7 is a cross sectional view showing manufacturing steps following FIG. 6.
Figure 8:
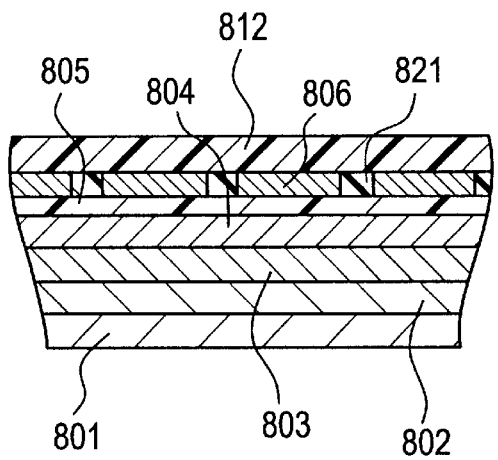
FIG. 8 is a cross sectional view showing manufacturing steps following FIG. 7.
Figure 9:
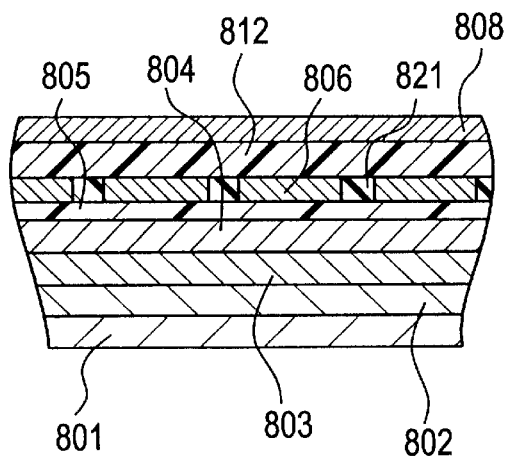
FIG. 9 is a cross sectional view showing manufacturing steps following FIG. 8.
Figure 10:
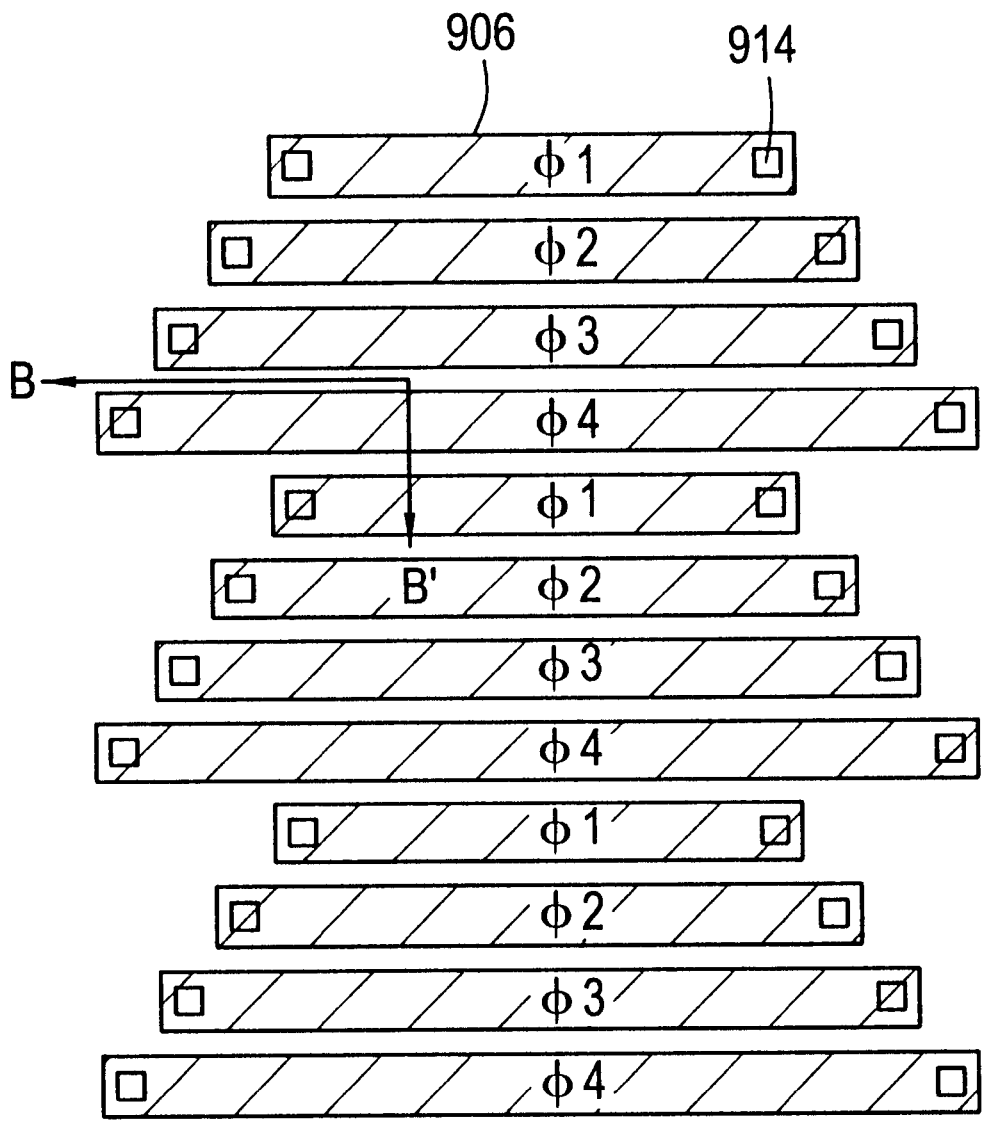
FIG. 10 is a plan view of a conventional solid state imaging pickup device in the related art.
Figure 11:
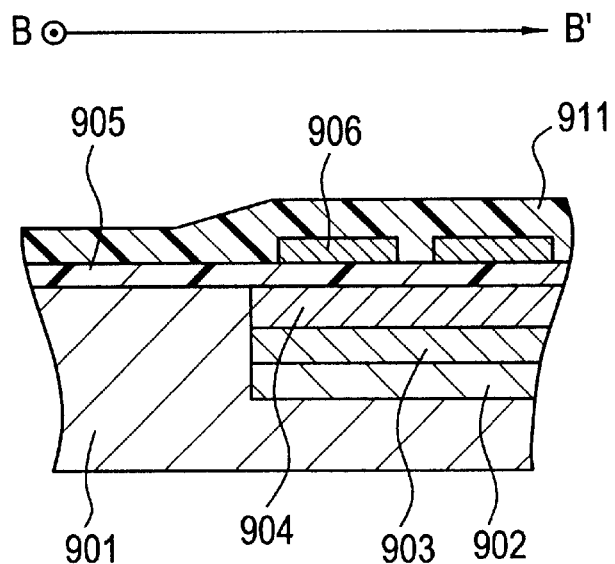
FIG. 11 is a cross sectional view showing problems of the conventional solid state imaging pickup device.
Figure 12:
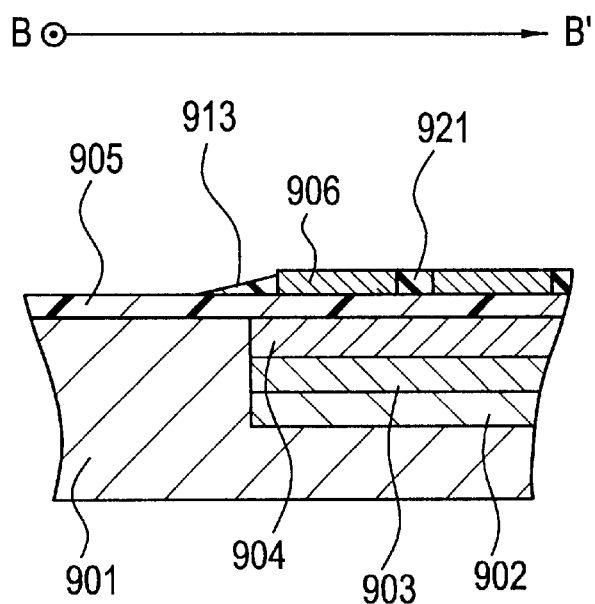
FIG. 12 is a cross sectional view showing manufacturing steps following FIG. 11.
Figure 13:
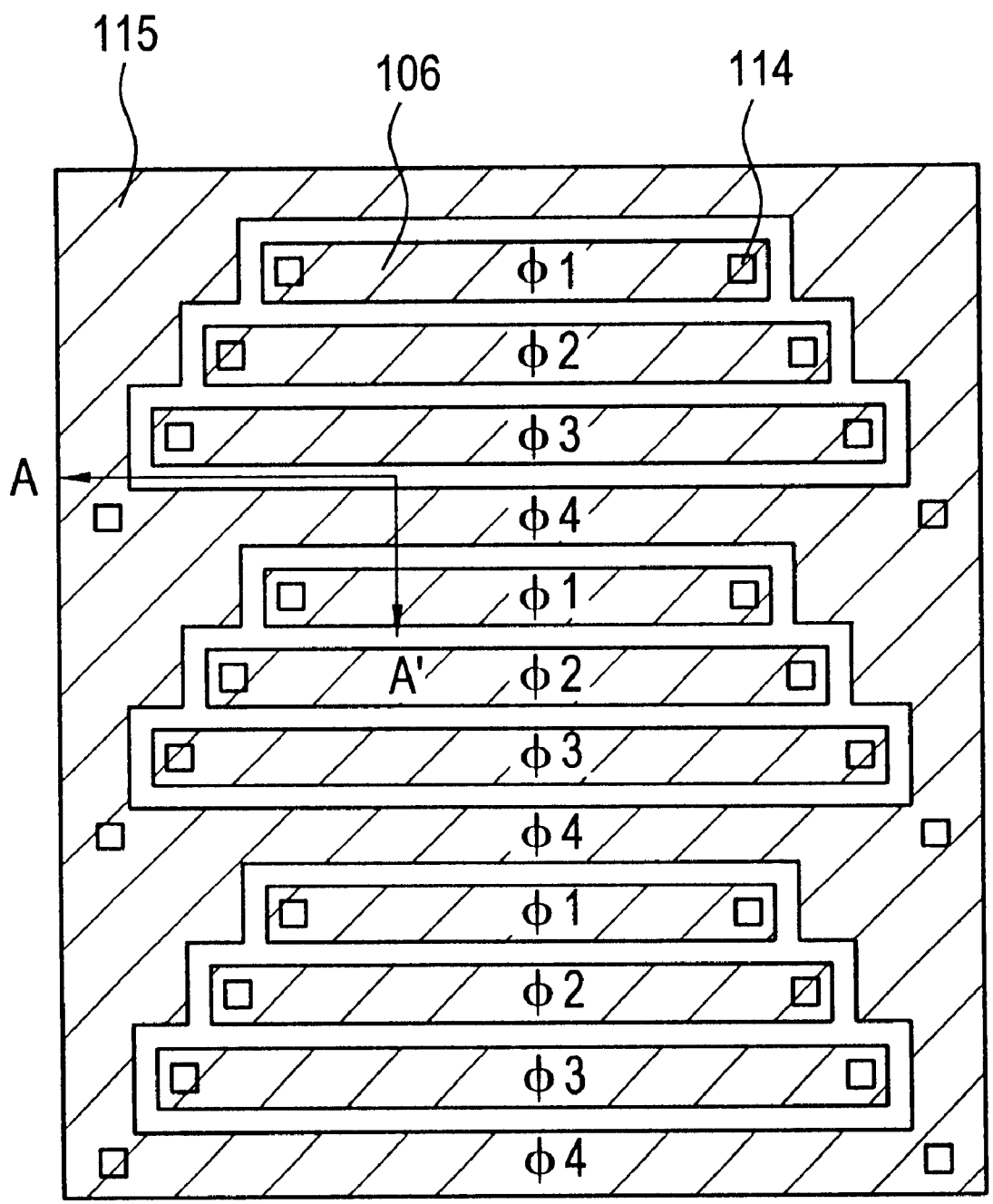
FIG. 13 is a plan view of a solid state imaging pickup device of a first embodiment of the present invention.

FIG. 13 typically shows an electrode pattern of a solid state imaging pickup device which is a first embodiment that advantageously uses the present invention and in which the charge transfer electrodes are made of a single-layer conductive electrode material film.

The charge transferring is performed by applying a four-phase driving pulse to the charge transfer electrodes. The charge transfer electrodes are organized in a repeating sequence of four, wherein the same phase driving pulses $\phi 1$ to $\phi 4$ are applied to corresponding charge transfer electrodes of each respective sequence. For example, $\phi 1$ is applied to every fourth charge transfer electrode, or in other words, to the first charge transfer electrode of each sequence. Four metal wirings for supplying the pulse voltage are formed corresponding to the forming position of each contact 114 in the vertical direction of the figure (not shown).

In the present embodiment, the charge transfer electrodes 106 of phases $\phi 1$, $\phi 2$, and $\phi 3$ are surrounded by a dummy pattern 115 interconnecting the charge transfer electrodes to which the driving pulse $\phi 4$ is applied at the peripheral part.

Figure 14:
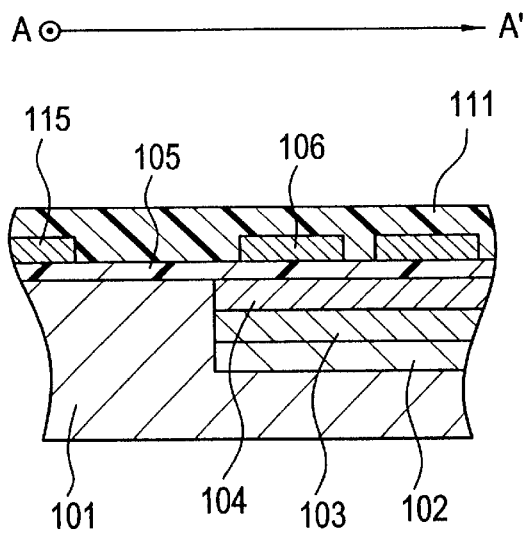
FIG. 14 is a cross sectional view showing a manufacturing method of a solid state imaging pickup device of the first embodiment of the present.
Figure 15A:
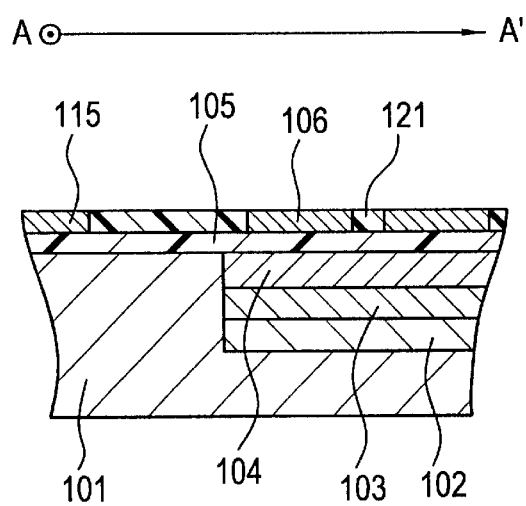
FIG. 15A is a cross sectional view showing manufacturing step following FIG. 14.
Figure 15B:
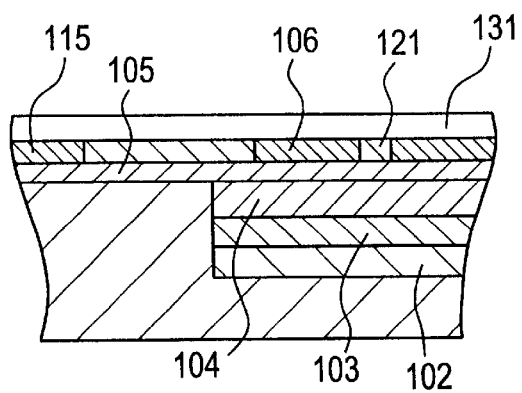
FIG. 15B is a cross sectional view showing manufacturing step following FIG. 15A.

Cross sectional views of the part along the line A–A' in FIG. 13 are shown in FIGS. 14, 15A, and 15B in the order of manufacturing steps. Other manufacturing methods may be used and the invention is not limited to the manufacturing method described herein.

First, a first P-type well layer 102, a second P-type well layer 103, a charge transfer part 104, and a gate insulating film 105 are formed in turn on an N-type semiconductor substrate 101, and further, charge transfer electrodes 106 with an inter-electrode gap of 0.25 $\mu$m to 0.50 $\mu$m are formed by patterning the conductive electrode material, which is for example 2500 angstrom to 4000 angstrom preferably 4000 angstrom, on the substrate 101. Then a first inter-layer insulating film 111 is formed thereon.

An insulating film with the re-flowing performance by heat, for example, a BPSG (BoroPhosphoSilicateGlass) film may be used as the first inter-layer insulating film 111, and it is re-flowed by being heat treated in an atmosphere of nitrogen at a temperature of about 850° C. to 950° C. after it has been deposited on the whole surface of the device, so that the charge transfer part may be planarized. As the first inter-layer insulating film 111, PSG (PhosphoSilicate Glass) film, or BSG (BoroSilicate Glass) film may also be used, but preferably BPSG may be used.

Under the layer where the charge transfer electrode 106 and the dummy pattern 115 function as the transfer electrodes, the gate insulating film 105 exists on the charge transfer part 104 formed on the N-type semiconductor substrate 101, the first P-type well layer 102, and the second P-type well layer 103 at the lower layer (as shown in FIG. 14).

Next, the first inter-layer insulating film 111 is formed. An embedded insulating film 121 is formed from the first inter-layer insulating film 11 that is embedded only in the inter-electrode gap part, by etching the first inter-layer insulting film 112 until the surface of the charge transfer electrode 106 is exposed (as shown in FIG. 15A).

At this moment, the dummy pattern 115 formed by a charge transfer electrode material exists beside the terminal part of the electrode, and it prevents the first inter-layer insulating film 111 from flowing out. Therefore, the embedded insulating film 121 is embedded to have the same height as the inter-electrode gap, between the terminal part of the charge transfer electrode and the dummy pattern.

Here, it is preferable for the distance between the terminal part of the charge transfer electrode 106 and the dummy pattern 115 to be 0.25 μm to 0.50 μm, similar to the distance of the inter-electrode gap. The reason is that in the first inter-layer insulating film 111 to be embedded between electrodes, the necessary film thickness thereof is determined by the distance between electrodes where the film is embedded, and thus it is possible to attain a greater improvement of the embedding performance in the case where the distances between electrodes are uniform.

After that, a second insulating film 131 is formed on that substrate (as shown in FIG. 15B).

In the first embodiment of the present invention, by surrounding the terminal part of the electrode pattern by interconnecting electrodes supplied with one phase, the outflow of the insulating film during the re-flowing is prevented. Consequently, the fluctuation of the film thickness at the electrode terminal part of the insulating film embedded in the inter-electrode gap part is prevented. Further, the control of the film thickness during the etching is also made easy, and it becomes possible to obtain a solid state imaging pickup device that has no step-cut of the metal wiring formed above and has a high reliability.

Next, a second embodiment of the present invention will be described with references to drawings.

Figure 16:
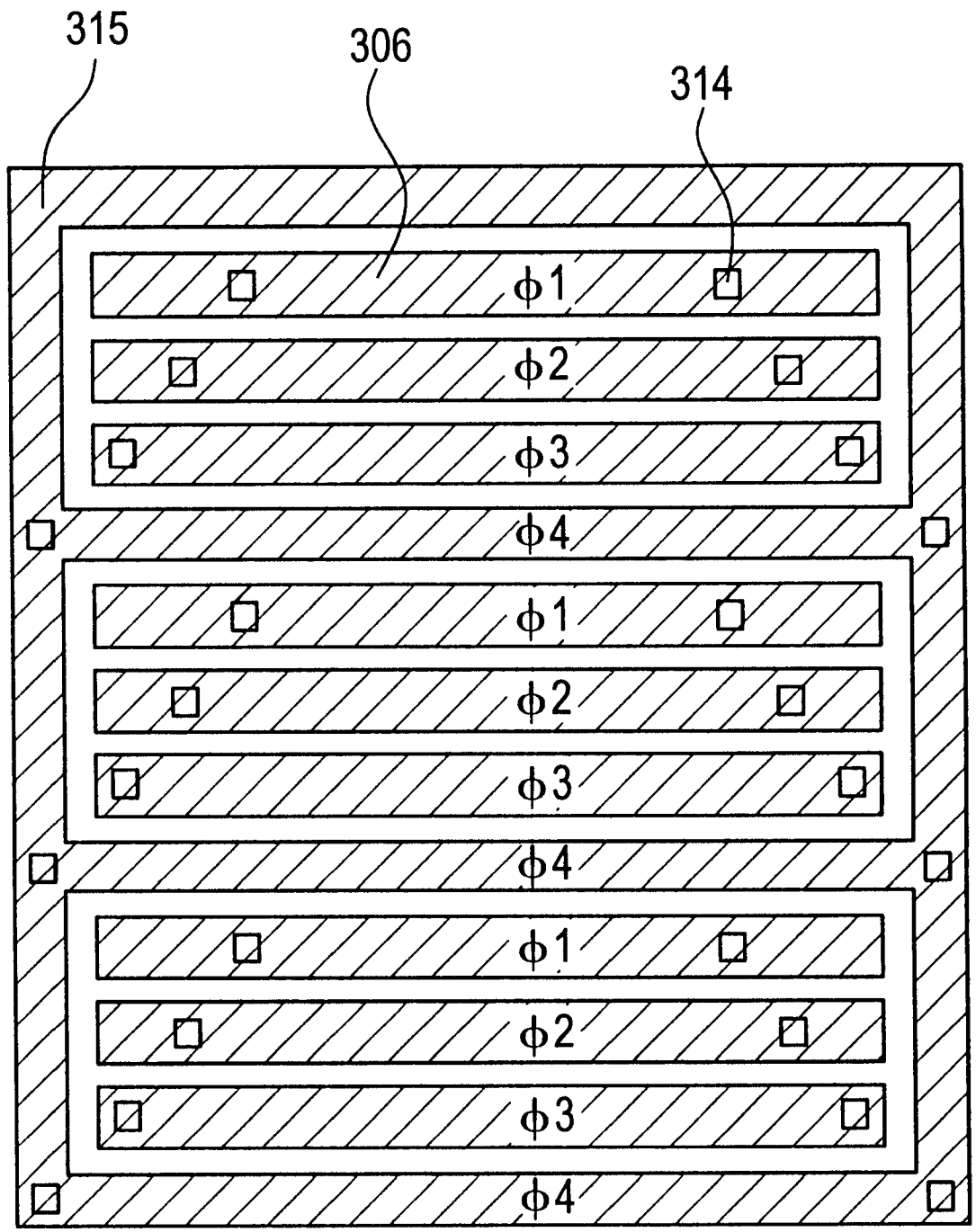
FIG. 16 is a plan view of a solid state imaging pickup device of a second embodiment of the present invention.

FIG. 16 typically shows an electrode pattern of a solid state imaging pickup device of the second embodiment in which the charge transfer electrodes are made of a single-layer conductive electrode material film.

The charge transferring is performed by a four-phase pulse, and the contacts are formed so that the same phase driving pulses are applied to the corresponding charge transfer electrodes of each sequence of four charge transfer electrodes. Four metal wirings for supplying the pulse voltage are formed corresponding to the upper position of each contact 314 in the vertical direction of the figure, which is not shown in the figure.

The structure of the present embodiment is different from that of the first embodiment in that the lateral lengths of the surrounded charge transfer electrodes 306 are uniform. When compared with the first embodiment, the number of corners of three-forked junctions made by the inter-electrode gaps formed between the surrounded charge transfer electrodes 306 and the dummy pattern 315 of the surrounding frame is decreased, and therefore, a more highly reliable embedding of an insulating film becomes possible. The reason is that the above described corners of three forked junctions have practical consequences similar to a wide inter-electrode gap, such that there is an increased probability of occurrence of poor embedding when forming an insulating film.

Next, a third embodiment of the present invention will be described with references to the drawings.

Figure 17:
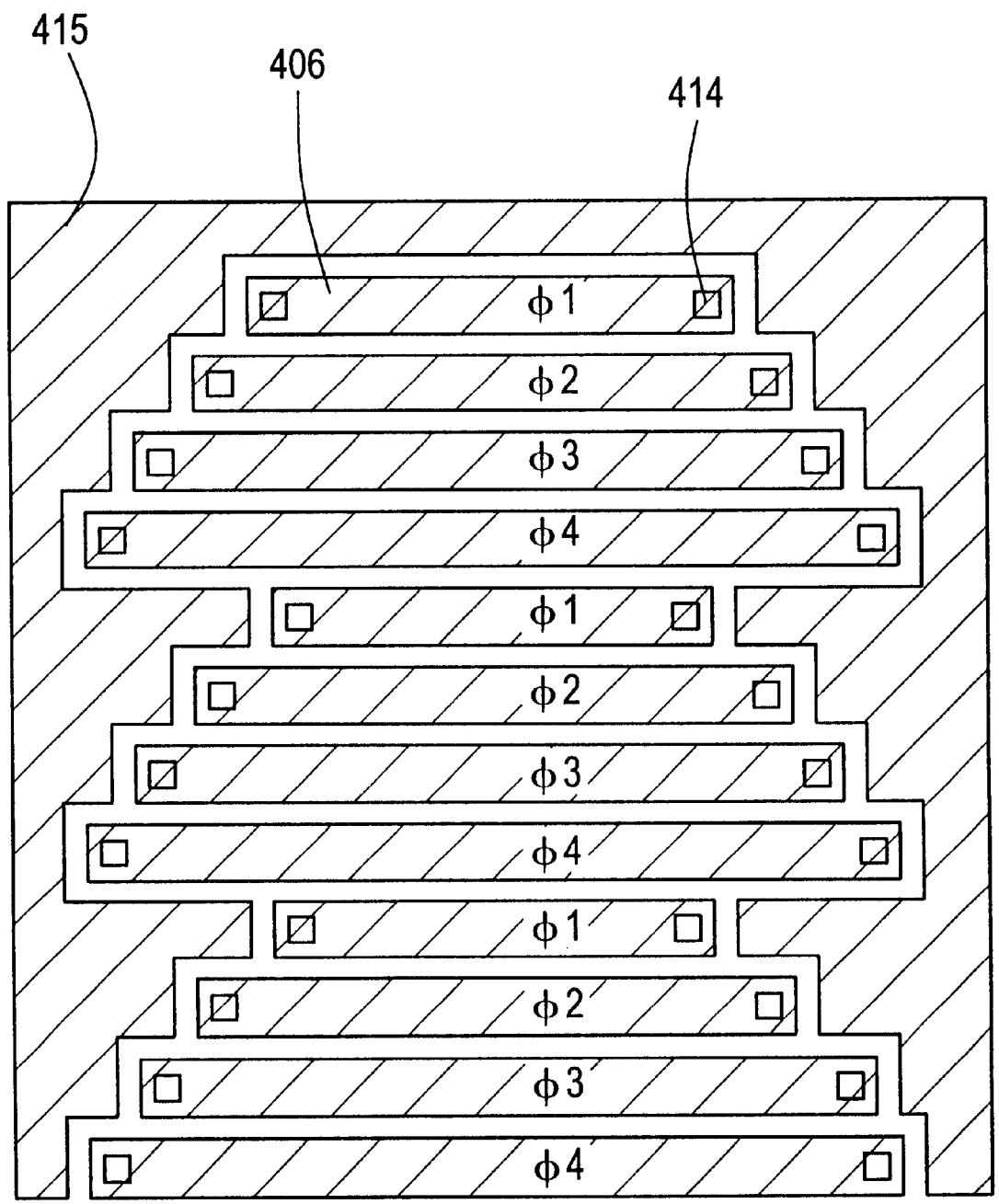
FIG. 17 is a plan view of a solid state imaging pickup device of a third embodiment of the present invention.

FIG. 17 typically shows an electrode pattern of a solid state imaging pickup device of the third embodiment in which the charge transfer electrodes are made of a single-layer conductive electrode material film.

The charge transfer electrodes 406 are surrounded by a dummy pattern 415.

In the present embodiment, the pattern 415 surrounding the charge transfer electrodes is a complete dummy pattern that is not connected to the charge transfer electrodes. Therefore, with regards to the short-circuit between the charge transfer electrodes because of the etching remainder leftover from forming the inter-electrode gaps, the probability of occurrence is reduced when compared with the cases of the above described two embodiments, and it has a benefit of making it possible to form a more highly reliable electrode wiring.

Next, a fourth embodiment of the present invention will be described with references to the drawings.

Figure 18:
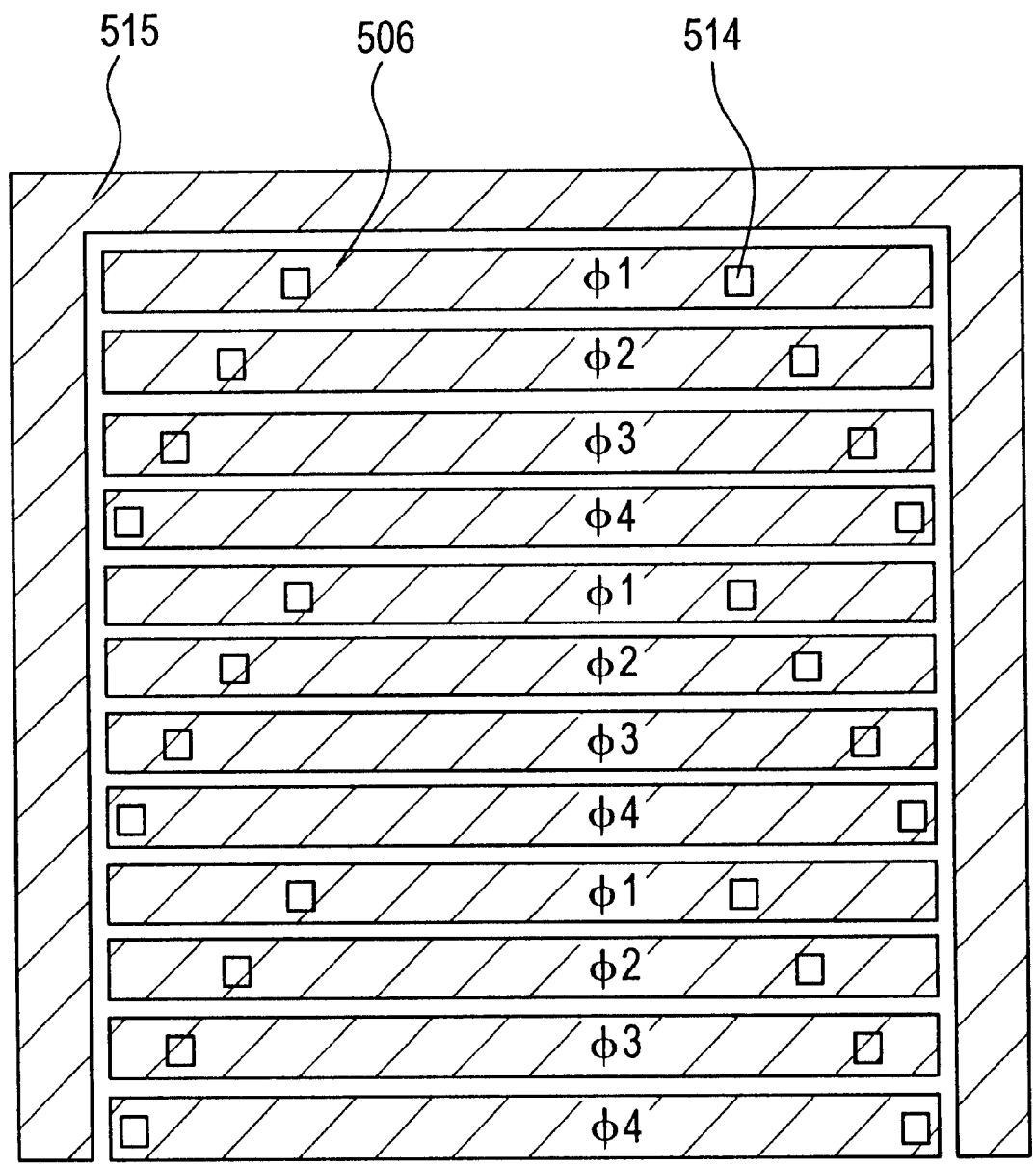
FIG. 18 is a plan view of a solid state imaging pickup device of a fourth embodiment of the present invention.

FIG. 18 typically shows an electrode pattern of a solid state imaging pickup device of the fourth embodiment in which the charge transfer electrodes are made of a single-layer conductive electrode material film.

The charge transfer electrodes 506 are surrounded by a dummy pattern 515.

In the present embodiment, in addition to the benefit described in the third embodiment, the number of corners or three-forked junctions, as described in the second embodiment, formed by the inter-electrode gaps is reduced when compared with the third embodiment, and therefore, a more highly reliable embedding of an insulating film is possible.

Herein, in the above described embodiment, a charge transfer electrode pattern in the case of using a four-phase driving pulse has been shown, but it goes without saying that the effectiveness is also kept in the case of using other pulses other than the four-phase driving pulse.

Furthermore, in the above described embodiment, the distances between the dummy pattern, and the charge transfer electrodes surrounded by the dummy pattern, has been described in the case where all the inter-electrode gaps have the same distance except for the part of a corner. Of course, it is necessary that all the distances between the electrodes above the charge transfer part are uniform in a plurality of inter-electrode places, but it is not always necessary that the distance between the electrode and the surrounding dummy pattern is the same as the distances between the electrodes in all area, and it is sufficient that the distance is the same distance as the distance between the electrodes or a fixed distance a little larger than that.

Actually, there are some cases where the distance between the electrodes should be a little wider at the part of a leading wire with no relation to the charge transfer at the peripheral part. This is because at the peripheral part, when thee is a step in the field oxide or the like, the peripheral part of the electrode runs over the step. Therefore, there is a fluctuation in focus depth when patterning the resist, resulting in differences in directional selectivity of the etchant (e.g., gas). Widening the distance between the electrodes at the peripheral part allows adjustment for differences in etching remainder produced by the fluctuation in focus depth, preventing short-circuits between the electrodes.

Thus, in the present invention, it is unnecessary that all the inter-electrode gaps have the same distance, and it is also possible that the gap has the same distance as the distance between the electrodes above the charge transfer part area or a fixed distance a little larger than that, in an area other than the charge transfer part.

Four embodiments of the present invention, the solid state imaging pickup device and manufacturing methods thereof, have been described above with reference to the drawings, but implementation of the invention is not limited to the present embodiments, and design can be changed within the scope of the present invention.

As described above, the present invention is a solid state imaging pickup device with a single-layer electrode structure which eliminates the release area at the terminal part of the charge transfer electrodes by surrounding the charge transfer electrodes with a dummy pattern, or with a pattern connecting the charge transfer electrodes of a certain phase with each other at the outermost periphery, and which improves the embedding performance of an insulating film when it is re-flowed for flattening the inter-electrode gaps. The present invention and makes it possible to form a good metal wire or shielding film with no step-cut, and makes it possible to provide a solid state imaging pickup device with a high reliability because of the above structure.

It is apparent that the present invention is not limited to the above embodiments, but may be modified and changed without departing from the scope and spirit of the invention.

What is claimed is:

1. A semiconductor device comprising:
    an insulating layer formed to cover a semiconductor substrate;
    a plurality of charge transfer electrodes formed on said insulating layer and arranged in first direction separately from one another, each of said charge transfer electrodes thereby having a first side that faces an adjacent one of said charge transfer electrodes with a first space, each of said charge transfer electrodes further having a second side that intersects with said first side;
    a dummy layer formed on said insulating layer and extended in said first direction separately from said charge transfer electrodes, said dummy layer thereby having a third side that faces said second side of each of said charge transfer electrodes with a second space; and
    an insulating film filling said first and second spaces.

2. The semiconductor device as claimed in claim 1, wherein said dummy layer is electrically isolated from said plurality of charge transfer electrodes.

3. The semiconductor device as claimed in claim 1, wherein one of said charge transfer electrodes is elongate in a second direction, which crosses said first direction, to thereby reach said dummy layer.

4. The semiconductor device as claimed in claim 1, wherein said first sides of said plurality of charge transfer electrodes have substantially the same length as each other.

5. The semiconductor device as claimed in claim 1, further comprising:
    a first wiring layer extended in said first direction over said plurality of charge transfer electrodes and electrically connected to one part of said plurality of charge transfer electrodes; and
    a second wiring layer extended in said first direction over said plurality of charge transfer electrodes and electrically connected to another part of said plurality of charge transfer electrodes,
    wherein said first sides of said one part of said plurality of charge transfer electrodes is substantially the same in length as each other, and said first sides of said another part of said plurality of charge transfer electrodes is substantially the same in length as each other and is larger in length than said first sides of said one part of said plurality of charge transfer electrodes.

6. The semiconductor device as claimed in claim 1, wherein said first sides are separate from each other at a first distance which is smaller than a second distance between said second side and said third side.

7. The semiconductor device as claimed in claim 1, wherein said first sides are separate from each other at a first distance which is substantially the same as a second distance between said second side and said third side.

8. The semiconductor device as claimed in claim 1, wherein said insulating film is made of a material having a re-flowing performance by heat.

9. The semiconductor device as claimed in claim 1, further comprising: a charge transfer part In said semiconductor substrate under said plurality of said charge transfer electrodes.

* * * * *